(12) United States Patent
Allen et al.

(10) Patent No.: US 8,802,347 B2
(45) Date of Patent: *Aug. 12, 2014

(54) SILICON CONTAINING COATING COMPOSITIONS AND METHODS OF USE

(75) Inventors: Robert D. Allen, San Jose, CA (US); Phillip J. Brock, San Jose, CA (US); Kuang-Jung Chen, Hopewell Junction, NY (US); Alexander Friz, San Jose, CA (US); Wu-Song Huang, Hopewell Junction, NY (US); Ratnam Sooriyakumaran, San Jose, CA (US); Sally A. Swanson, San Jose, CA (US); Hoa D. Truong, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 545 days.

This patent is subject to a terminal disclaimer.

(21) Appl. No.: 12/613,804

(22) Filed: Nov. 6, 2009

(65) Prior Publication Data

US 2011/0111345 A1 May 12, 2011

(51) Int. Cl.
*G03F 7/039* (2006.01)
*G03F 7/11* (2006.01)
*G03F 7/20* (2006.01)
*G03F 7/30* (2006.01)
*G03F 7/38* (2006.01)

(52) U.S. Cl.
USPC ........ 430/270.1; 430/311; 430/313; 430/326; 430/330; 430/910

(58) Field of Classification Search
None
See application file for complete search history.

(56) References Cited

U.S. PATENT DOCUMENTS

| | | | |
|---|---|---|---|
| 5,679,495 A | 10/1997 | Yamachika et al. | |
| 6,028,154 A | 2/2000 | Schaedeli et al. | |
| 6,207,342 B1 | 3/2001 | Takechi et al. | |
| 6,444,408 B1 | 9/2002 | Brock et al. | |
| 6,537,727 B2 | 3/2003 | Yoon et al. | |
| 6,849,382 B2 | 2/2005 | Choi | |
| 7,193,023 B2 | 3/2007 | Allen et al. | |
| 7,279,256 B2 | 10/2007 | Son | |
| 7,504,194 B2 | 3/2009 | Fukuhara et al. | |
| 7,569,326 B2 * | 8/2009 | Ohsawa et al. | 430/270.1 |
| 2002/0061465 A1 * | 5/2002 | Hasegawa et al. | 430/270.1 |
| 2002/0173609 A1 | 11/2002 | Lee et al. | |
| 2008/0171270 A1 | 7/2008 | Padmanaban et al. | |
| 2008/0268375 A1 * | 10/2008 | Hayashi et al. | 430/281.1 |
| 2009/0061359 A1 * | 3/2009 | Nozaki et al. | 430/287.1 |

FOREIGN PATENT DOCUMENTS

EP 0758102 A1 2/1997

OTHER PUBLICATIONS

Hand, A., "Tricks with Water and Light: 193 nm Extension", Semiconductor International, vol. 27, Issue 2, Feb. 2004, pp. 1-7.
Slezak, M., "Exploring the needs and tradeoffs for immersion resist topcoating", Solid State Technology, vol. 47, Issue 7, Jul. 2004, pp. 1-4.
International Search Report and The Written Opinion of the International Searching Authority, or the Declaration, for International Application No. PCT/EP2010/063420; International Filing Date: Sep. 14, 2010; Date of Mailing: Dec. 20, 2010; 10 pages.
Reichmanis, E., "Chemical Amplification Mechanisms for Microlithography", American Chemical Society, vol. 3, Mar. 1991, pp. 394-397.

* cited by examiner

*Primary Examiner* — Sin J. Lee
(74) *Attorney, Agent, or Firm* — Cantor Colburn LLP

(57) ABSTRACT

Coating compositions include a polymer including:

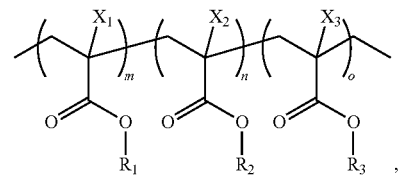

wherein $R_1$ is a silicon containing moiety, $R_2$ is an acid stable lactone functionality, and $R_3$ is an acid labile lactone functionality; $X_1$, $X_2$, $X_3$ are independently H or $CH_3$; and m and o are non-zero positive integers and n is zero or a positive integer representing the number of repeat units; a photoacid generator; and a solvent. Also disclosed are methods for forming a pattern in the coating composition containing the same.

20 Claims, 6 Drawing Sheets

130 nm 140 nm 150 nm

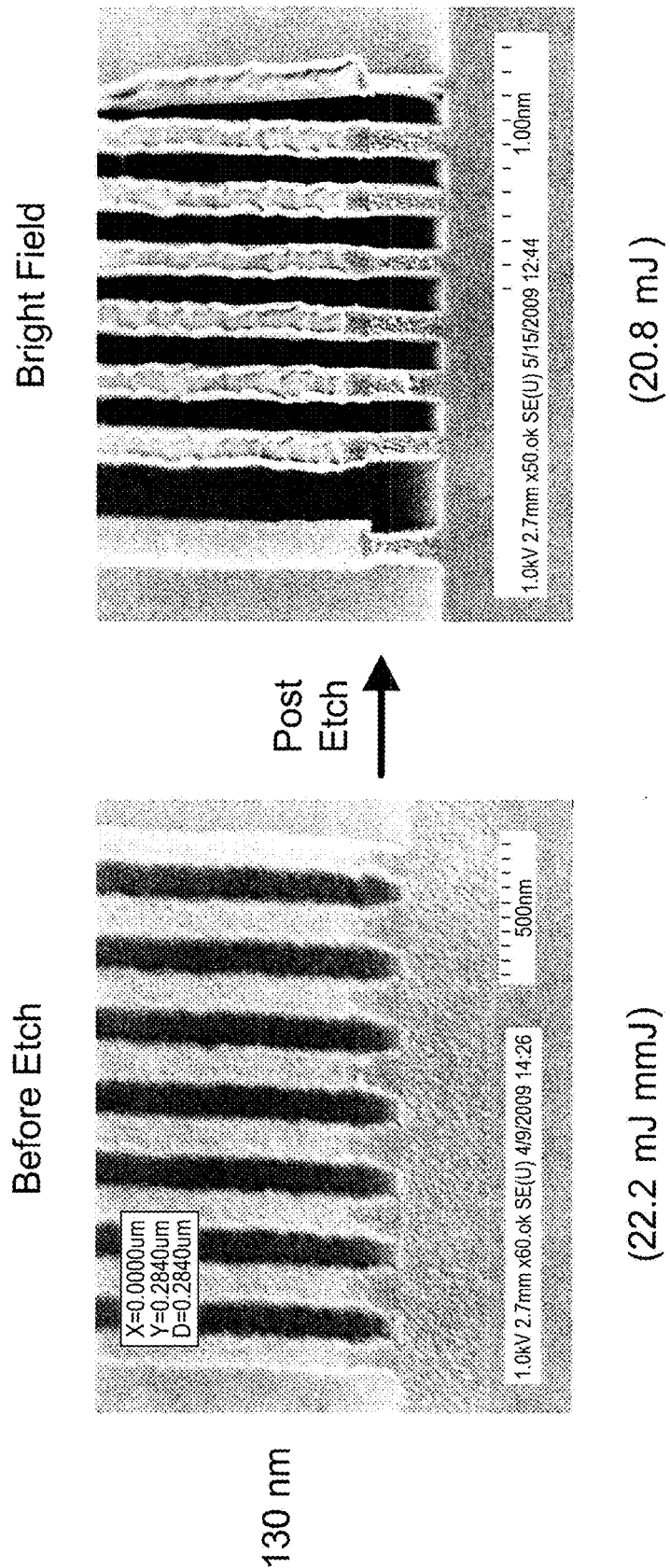
FIG. 5A (22.2 mJ mmJ)
FIG. 5B (20.8 mJ)

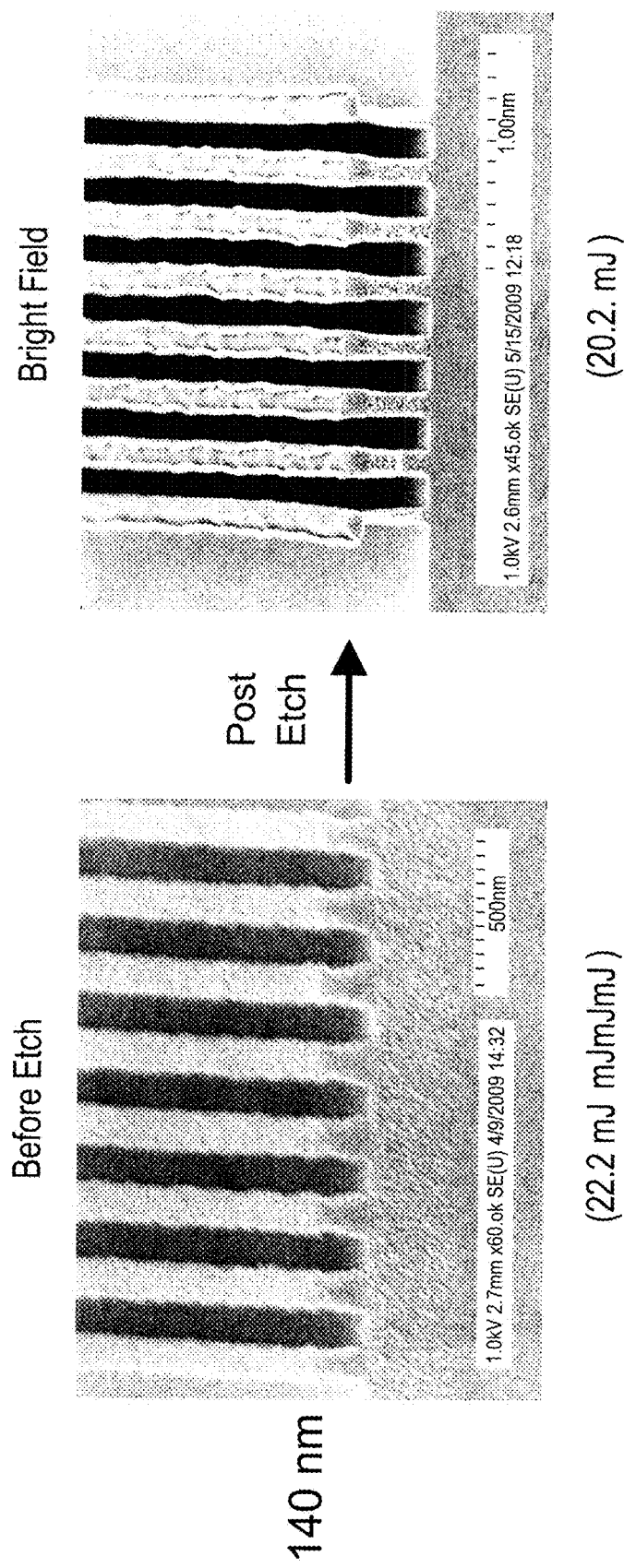
FIG. 6A (22.2 mJ mJmJmJ) Before Etch 140 nm
Post Etch →
FIG. 6B (20.2. mJ) Bright Field

ABSTRACT

SILICON CONTAINING COATING COMPOSITIONS AND METHODS OF USE

BACKGROUND

This invention relates to silicon containing resist formulations, and more particularly, to silicon containing photoresist compositions that are suitable for immersion lithography.

The patterning of radiation sensitive polymeric films with high energy radiation flux such as photons, electrons, or ion beams is the principle means of defining high resolution circuitry found in semiconductor devices. The radiation sensitive films, often referred to as photoresists regardless of the radiation source, generally consist of multi-component formulations that are coated onto a desired substrate such as a silicon wafer. The photoresist film is then exposed to radiation. The radiation is most commonly ultraviolet light at wavelengths of 436, 365, 257, 248, 193 or 157 nanometers (nm), or a beam of electrons or ions, or 'soft' x-ray radiation, also referred to as extreme ultraviolet (EUV) or x-rays. The radiation is exposed pattern-wise to induce a chemical transformation that renders the solubility of the exposed regions of the film different from that of the unexposed areas. The film is then heated to enhance this chemical transformation. After heating, the film is treated with an appropriate developer, usually a dilute, basic aqueous solution, such as aqueous tetramethylammonium hydroxide (TMAH) to develop the photoresist image on the wafer.

Typical photoresists contain a polymeric component and are generally comprised of a polymeric matrix, a radiation sensitive component, a casting solvent, and other performance enhancing additives. The highest performing photoresists in terms of sensitivity to radiation and resolution capability are the so-called "chemically amplified" photoresists, which provide high resolution, high contrast, and high sensitivity that are not generally provided by other photoresists. Chemically amplified photoresists are based on a catalytic mechanism that allows a relatively large number of chemical events to occur such as, for example, deprotection reactions in the case of positive tone photoresists or crosslinking reactions in the case of negative tone photoresists. The deprotection and/or crosslinking reactions are brought about by the application of a relatively low dose of radiation that induces formation of a catalyst, often a strong acid.

Most of the current positive resist compositions comprise aqueous base soluble functional groups that are sufficiently protected with acid labile groups so that the resist initially will not dissolve in a developer. During exposure to radiation, the photoacid generator (PAG) present in the resist composition produces strong acid, which then catalyzes the removal of the acid labile groups on heating (i.e., upon post exposure baking (PEB)). This process produces aqueous base soluble material in the exposed regions, which is then developed with a basic aqueous developer to produce the images. An image of the projected pattern-wise radiation is formed in the resist film after development, which can then serve as an etch-resistant mask for subsequent pattern transfer steps. The resolution obtained is dependent on the quality of the aerial image and the ability of the resist to maintain that image.

The resolution, R, of an optical projection system such as a lithography stepper is limited by parameters described in Raleigh's equation:

$$R = k\lambda/NA,$$

where $\lambda$ represents the wavelength of the light source used in the projection system and NA represents the numerical aperture of the projection optics used. The term "k" represents a factor describing how well a combined lithography system can utilize the theoretical resolution limit in practice and can range from about 0.85 down to about 0.35 for standard exposure systems. The theoretical dimensional limit of equal-sized half-pitch features is one quarter of the wavelength, $\lambda(k=0.25)$ when NA=1, as the dose applied to the resist is equal to the square of the intensity, and thus the resolution cannot be modulated by any more than $\lambda/4$, or a pitch of $\lambda/2$. The resolution attainable with each advancing generation of materials has been extended toward these limits through the use of low k techniques and high numerical aperture tools. To obtain images below this feature size using optical lithography, an extension of NA to >1 is needed. Immersion lithography enables lens designs with NA greater than 1.0, thus resulting in an increased resolution of optical scanners. This process requires filling the gap between the last lens element of the exposure tool and the resist-coated substrate with ultra-pure water. See A. Hand, "Tricks with Water and Light: 193 nm Extension", Semiconductor International, Vol. 27, Issue 2, February 2004.

One of the technical challenges facing immersion lithography is the diffusion between the photoresist components and the immersion medium. That is, during the immersion lithographic process, the photoresist components leach into the immersion medium and the immersion medium permeates into the photoresist film. Such diffusion is detrimental to photoresist performance and might result in disastrous lens damage or contamination in a lithography tool that currently costs about 40 million dollars. Therefore, there is a need for a method to prevent interaction between photoresist layers and immersion fluid in an immersion lithography system.

One of the methods that have been quickly adopted by the resist community is the application of topcoat materials on top of the photoresist layer for the purpose of eliminating diffusion of materials from the underlying photoresist layer and to prevent the permeation of the exposure medium into the photoresist film. See, M. Slezak, "Exploring the needs and tradeoffs for immersion resist topcoating", Solid State Technology, Vol. 47, Issue 7, July 2004. Since water was first proposed as the exposure medium for 193 nm immersion lithography, several topcoat materials have been reported.

As described above, the higher NA allows for improved resolution of smaller feature sizes, however, the higher NA also reduces the depth of focus of aerial images projected onto the resist film. When the depth of focus is relatively shallow, the thickness of the resist film becomes a factor in achieving proper exposure. Thus, thinner resist films may be required for proper exposure at high resolution, but such films often do not yield acceptable overall performance, especially when considering etch requirements for the underlying substrate.

As the resist film is thinned to account for the higher NA, the resist becomes less suitable as an etch mask against later processing of the underlying semiconductor substrate. For example, since the resist film is thin, variation in thickness becomes more significant and may introduce defects into subsequent devices formed on the substrate. Also, micro-channels often form in the upper portions of a resist layer during transfer of the resist image to the substrate by etching. When the resist layer is thin, the micro-channels may extend to the underlying substrate, rendering the resist less effective as a mask.

In addition, the process latitude of many current resists is not sufficient to consistently produce the smaller desired features within specified tolerances. Some of the process parameters where variance may be difficult to avoid include bake time and temperature, exposure time and source output, aerial image focus, and develop time and temperature. The process latitude of a resist is an indication of how wide such variations can be without resulting in a change in the resolution and/or image profile (i.e., size and/or shape of a resist image). That is, if the process latitude is sufficiently wide, then a process parameter may vary, but the variance will not produce a change in the resist image incompatible with specified tolerances.

Another problem that occurs as feature size decreases and pattern density increases is that collapsing of such high aspect ratio features in the resist may occur. Thus, a thinner resist layer may be required to minimize image collapse.

One approach that enables the use of higher NA exposure tools (including 193 nm immersion tools) as well as a thinner photoresist film is multilayer resist processing. One type of multilayer resist processing uses a bilayer (two layer) imaging scheme by first casting a highly energy absorbing underlayer on the semiconductor substrate and then casting a thin, silicon-containing imaging layer (photoresist film) on top of the underlayer. Next, selected portions of the silicon-containing layer are exposed and developed to remove the unexposed portions of a negative photoresist film or the exposed portions of a positive photoresist film. Generally, the underlayer is highly absorbing at the imaging wavelength and is compatible with the imaging layer. Interactions to be considered include adhesion between the two layers, intermixing, and contamination of the imaging layer by the components of the underlayer. Also, the refractive index of the underlayer is matched to the refractive index of the silicon-containing resist layer to avoid degrading the resolution capability of the silicon-containing resist.

As described above, protective topcoats are currently considered vitally important for water immersion lithography. However, the silicon containing resists previously developed are not compatible with current topcoat formulations comprising alcohol solvents (e.g., 4-methyl-2-pentanol). In order to achieve higher resolution by utilizing a bilayer imaging scheme under immersion conditions, there is a need to develop bilayer resists that are compatible with alcohol solvents.

SUMMARY

The shortcomings of the prior art are overcome and additional advantages are provided through the provision of a coating composition comprising a polymer comprising

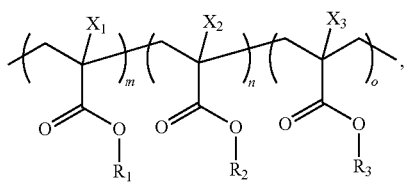

wherein $R_1$ is a silicon containing moiety, $R_2$ is an acid stable lactone functionality, and $R_3$ is an acid labile lactone functionality; $X_1, X_2, X_3$ are independently H or $CH_3$; and m and o are non-zero positive integers and n is zero or a positive integer representing the number of repeat units; a photoacid generator; and a solvent.

In another embodiment, a method of forming an image in a photoresist layer comprises forming a photoresist layer on a substrate, wherein the photoresist layer comprises a polymer comprising:

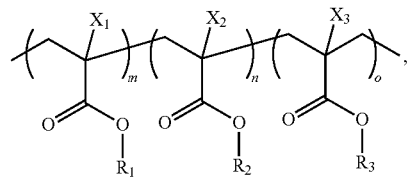

wherein $R_1$ is a silicon containing moiety, $R_2$ is an acid stable lactone functionality, and $R_3$ is an acid labile lactone functionality; $X_1, X_2, X_3$ are independently H or $CH_3$; and m and o are non-zero positive integers and n is zero or a positive integer representing the number of repeat units; a photoacid generator; and a solvent; exposing the photoresist layer to radiation through a photomask, wherein the radiation changes the chemical composition of regions of the photoresist layer exposed to the radiation forming exposed and unexposed regions in the photoresist layer; and optionally baking the exposed photoresist layer to promote acid-catalyzed reaction in exposed portions of the photoresist layer; developing the photoresist layer to form a relief pattern; and transferring the pattern of spaces to the substrate.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
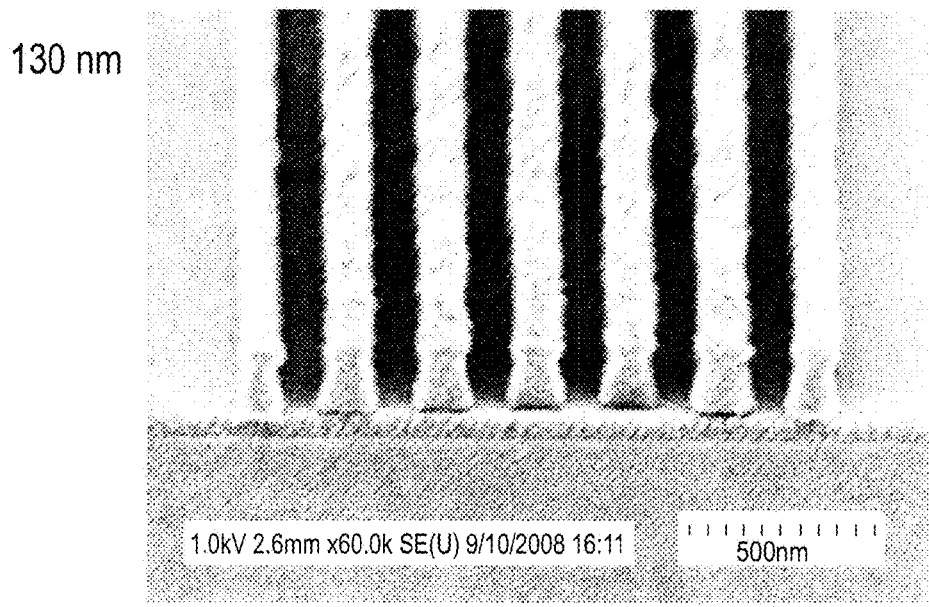
FIGS. 1-3 depict scanning electron micrographs for cross-sectional views of 130 nanometer (nm), 140 nm, and 150 nm line space pairs, respectively.

The detailed description explains the preferred embodiments of the invention, together with advantages and features, by way of example with reference to the drawings.

DETAILED DESCRIPTION

Disclosed herein are silicon based photoresist formulations suitable for immersion lithography applications that provide compatibility with topcoat formulations comprising alcohol solvents, thereby overcoming some of the problems noted in the prior art.

The silicon based resist formulations generally include a silicone based polymer, a photoacid generator, optional solvents, and optional additives as will be discussed below. The silicon based polymer is of the following structure (I):

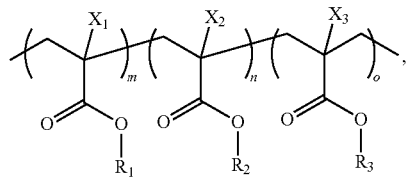

(I)

wherein $R_1$ is a silicon containing moiety, $R_2$ is an acid stable lactone functionality, and $R_3$ is an acid labile lactone functionality; $X_1, X_2, X_3$ are independently H or $CH_3$; and m and o are non-zero positive integers and n is zero or a positive integer representing the number of repeat units. In the embodiments that follow, the silicon content is greater than about 5 percent by weight of the polymer in order to provide good etch selectivity with respect to the underlayer for anisotropic dry etch processing, such as reactive ion etch (RIE) using an oxygen-containing plasma. By increasing the amount of lactone content (greater than or equal to 60 mole percent based on the polymer), compatibility with the topcoat formulations is markedly improved, especially those topcoat formulations that have been formulated with alcohol solvents.

In the silicon based polymer shown above, the silicon containing moiety (m) is 10 to 40 mol percent, the acid stable lactone functionality (n) is 0 to 60 mol percent and the acid labile lactone functionality (o) is 20 to 90 mol percent of the polymer. In another embodiment, the silicon containing moiety (m) is 20 to 40 mol percent, the acid stable lactone functionality (n) is 10 to 40 percent and the acid labile lactone functionality (o) is 20 to 70 percent of the polymer. In still another embodiment, the silicon containing moiety (m) is 20 to 40 percent, the acid stable lactone functionality (n) is 20 to 40 percent and the acid labile lactone functionality (o) is 20 to 60 percent based of the polymer.

In one embodiment, the silicon based polymer has a ratio of n+o to m+n+o $$\left(\text{i.e., } \frac{n+o}{m+n+o}\right)$$

that is greater than or equal to 0.6. In other embodiments, the ratio is greater than 0.7; and in still other embodiments, the ratio is greater than 0.8.

Exemplary silicon containing moieties include, without limitation, methacryloxypropyltris(trimethylsiloxy)silane, methacryloxypropyltris(trimethylsilyl)silane, bis(trimethylsilyl)methyl methacrylate (BTMSMMA), as shown below, and mixtures thereof.

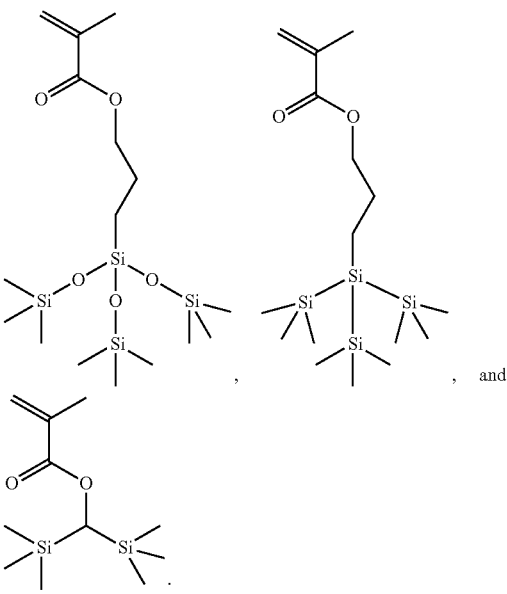

, and

Exemplary acid stable lactone functionalities are formed from monomers including, without limitation, 5-methacyloyloxy-2,6-norboranecarbolactone (NLM), α-methacryloxy-β, β-dimethyl-γ-butyrolactone and α-methacryloxy-γ-butyrolactone as shown below, and mixtures thereof. As used herein, the term "acid stable" refers to a substituent that is not cleaved or otherwise chemically modified upon contact with photogenerated acid.

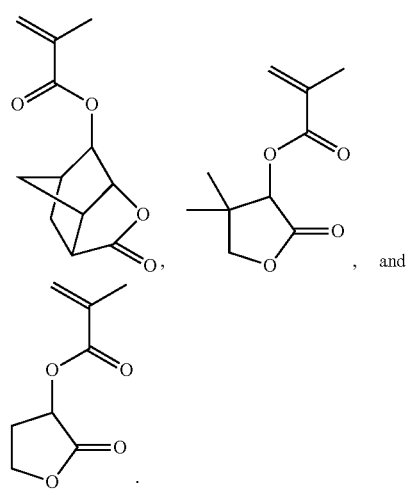

, and

Exemplary acid labile lactone functionalities include, without limitation, γ-methacryloxy-γ-methyl-γ-butyrolactone (i.e., angelicalactone methacrylate, ALMA), γ-methacryloxy-γ-methyl-δ-valerolactone (i.e., mevaloniclactone methacrylate, MLMA) as shown below, and mixtures thereof. As used herein, the term "acid labile" refers to a molecular segment containing at least one covalent bond that is cleaved upon exposure to acid. Typically, the reaction of acid-cleavable groups herein with photogenerated acid occurs only, or is promoted greatly by, the application of heat. Those skilled in the art will recognize the various factors that influence the rate and ultimate degree of cleavage of acid-cleavable groups as well as the issues surrounding integration of the cleavage step into a viable manufacturing process. The product of the cleavage reaction is generally an acidic group, which, when present in sufficient quantities, imparts solubility to the polymers of the invention in basic aqueous solutions.

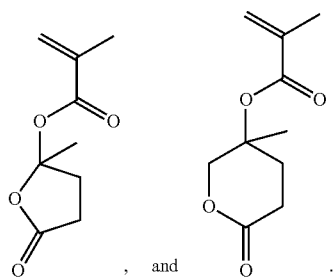

An exemplary silicon based polymer includes

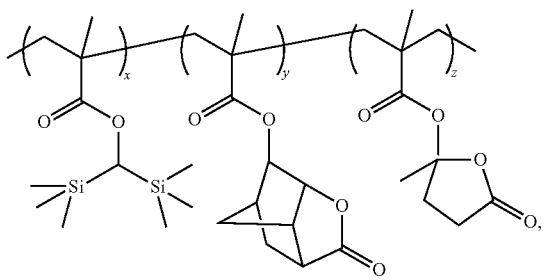

wherein the ratio of x, y and z is 30:20:50.

Another exemplary silicon based polymer includes structure:

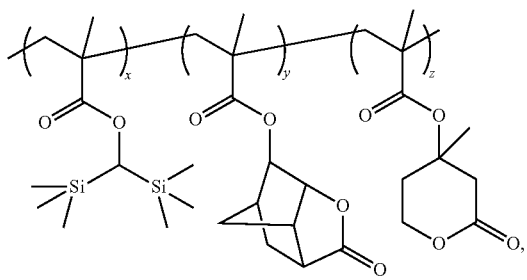

wherein a ratio of x, y, and z is 29:21:50.

In one embodiment, the silicon containing polymer of the present invention has an average weight molecular weight of 2,000 to 100,000 Daltons; in other embodiments, the silicon containing polymer has an average weight molecular weight of 2,000 to 10,000 K Daltons; and in still other embodiments, the silicon containing polymer has an average weight molecular weight of 4,000 to 10,000 K Daltons. The preferred polydispersity index (PDI) of the polymers is from 1 to 3.

The silicon based resist composition further includes a radiation sensitive photoacid generator (PAG). These PAGs are compounds that generate an acid upon exposure to actinic radiation. In various embodiments, any suitable photoacid generating agent may be used including ionic and nonionic PAGs, so long as the selected photoacid generator dissolves sufficiently in the coating composition, and the resulting solution thereof may form a coating on a substrate by a dispensing process, or spin coating, or the like. As is well known to those skilled in the art after reading the present application, the following illustrative classes of photoacid generators may be employed in various embodiments of the present invention.

Typical photoacid generators include, without limitation: (1) sulfonium salts, such as triphenylsulfonium perfluoromethanesulfonate (triphenylsulfonium triflate), triphenylsulfonium perfluorobutanesulfonate, triphenylsulfonium perfluoropentane-sulfonate, triphenylsulfonium perfluorooctanesulfonate, triphenylsulfonium hexafluoroantimonate, triphenylsulfonium hexafluoro arsenate, triphenylsulfonium hexafluorophosphate, triphenylsulfonium bromide, triphenylsulfonium chloride, triphenyl-sulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium perfluorooctane sulfonate, diphenylethylsulfonium chloride, and phenacyldimethylsulfonium chloride; (2) halonium salts, particularly iodonium salts, including diphenyliodonium perfluoromethanesulfonate (diphenyliodonium triflate), diphenyliodonium perfluorobutanesulfonate, diphenyliodonium perfluoropentane-sulfonate, diphenyliodonium perfluorooctanesulfonate, diphenyliodonium hexafluoroantimonate, diphenyliodonium hexafluoroarsenate, bis-(t-butylphenyl)-iodonium triflate, and bis-(t-butylphenyl)-iodonium camphanylsulfonate; (3) α, a'-bis-sulfonyldiazomethanes such as bis(p-toluenesulfonyl)diazomethane, methylsulfonyl p-toluenesulfonyldiazomethane, 1-cyclohexylsulfonyl-1-(1,1-dimethylethylsulfonyl)diazomethane, and bis(cyclohexylsulfonyl)diazomethane; (4) trifluoromethanesulfonate esters of imides and hydroxyimides, e.g., α-(trifluoromethylsulfonyloxy)-bicyclo [2.2.1]hept-5-ene-2,3-dicarboximide (MDT); (5) nitrobenzyl sulfonate esters such as 2-nitrobenzyl p-toluenesulfonate, 2,6dinitrobenzyl p-toluenesulfonate, and 2,4-dinitrobenzyl p-trifluoromethylbenzene sulfonate; (6) sulfonyloxynaphthalimides such as N-camphorsulfonyloxynaphthalimide and N-pentafluorophenylsulfonyloxynaphthalimide; (7) pyrogallol derivatives (e.g., trimesylate of pyrogallol); (8) naphthoquinone-4-diazides; (9) alkyl disulfones; (10) s-triazine derivatives; and (11) miscellaneous sulfonic acid generators including t-butylphenyl-α-(ptoluenesulfonyloxy)-acetate, t-butyl-α-(p-toluenesulfonyloxy)acetate, and N-hydroxynaphthalimide dodecane sulfonate (DDSN), and benzoin tosylate.

Other suitable photoacid generators are disclosed in Reichmanis et al. (1991), *Chemistry of Materials* 3:395, and in U.S. Pat. No. 5,679,495 to Yamachika et al. Additional suitable acid generators useful in conjunction with the compositions and methods provided herein will be known to those skilled in the art and/or are described in the pertinent literature.

By way of example, the PAG of the coating composition may include at least one of the following structures (VI-VIII):

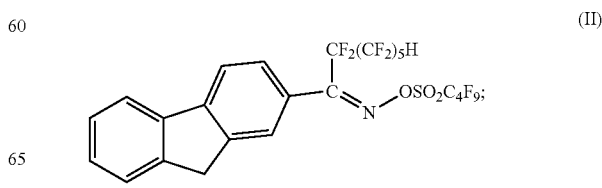

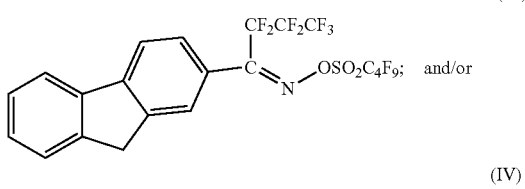

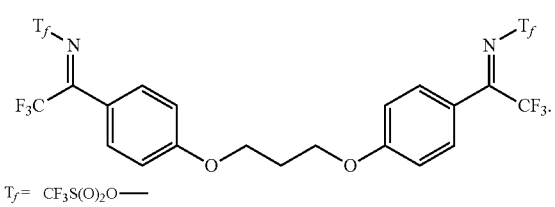

$T_f$= CF$_3$S(O)$_2$O—

The photoacid generator is present in the resist composition in an amount of from about 0.5 wt % to about 20 wt %, more particularly about 3 wt % to about 15 wt %, based on the total weight of the polymer of the silicon based resist composition. The resist composition can comprise more than one photoacid generator.

A casting solvent can be used to prepare a film of the silicon based resist composition. The choice of solvent is governed by many factors not limited to the solubility and miscibility of resist components, the coating process, and safety and environmental regulations. Additionally, inertness to other resist components is desirable. It is also desirable that the solvent possess the appropriate volatility to allow uniform coating of films yet also allow significant reduction or complete removal of residual solvent during the post-application bake process. Solvents may generally be chosen from ether-, ester-, hydroxyl-, and ketone-containing compounds, or mixtures of these compounds. Examples of appropriate solvents include cyclopentanone, cyclohexanone, lactate esters such as ethyl lactate, alkylene glycol alkyl ether esters such as propylene glycol methyl ether acetate, alkylene glycol monoalkyl esters such as methyl cellosolve, butyl acetate, 2-ethoxyethanol, and ethyl 3-ethoxypropionate. Preferred solvents include ethyl lactate, propylene glycol methyl ether acetate, and mixtures of ethyl lactate and ethyl 3-ethoxyproprionate. The above list of solvents is for illustrative purposes only and should not be viewed as being comprehensive nor should the choice of solvent be viewed as limiting the invention in any way. Those skilled in the art will recognize that any number of solvents or solvent mixtures may be used. When a solvent is present, the resist composition contains about 50 to about 98 wt. % solvent based on total weight of the resist composition.

Other customary additives may also be present in the photoresist composition, including pigments, sensitizers, preservatives, acid-diffusion controlling agents, coating aids such as surfactants or anti-foaming agents, adhesion promoters, plasticizers, and dissolution inhibitors, surface modifying agents, among others. Typically, the sum of all customary additives will comprise less than 20 percent of the solids included in the resist formulation, preferably, less than 5 percent.

Pigments may be used to adjust the optical density of the formulated resist and sensitizer, which can enhance the activity of photoacid generators by absorbing radiation and transferring it to the photoacid generator. Examples include aromatics such as functionalized benzenes, pyridines, pyrimidines, biphenylenes, indenes, naphthalenes, coumarins, anthraquinones, and other aromatic ketones.

A wide variety of compounds with varying basicity may be used as preservatives and acid-diffusion controlling additives. They may include nitrogenous compounds such as aliphatic primary, secondary, and tertiary amines, cyclic amines such as piperidines, pyrimidines, morpholines, aromatic heterocycles such as pyridines, pyrimidines, purines, imines such as diazabicycloundecene (DBU), guanidines, imides, amides, and others. Ammonium salts of basic anions may also be used, including ammonium, primary, secondary, tertiary, and quaternary alkyl-and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed. Surfactants may be used to improve coating uniformity, and include a wide variety of ionic and non-ionic, monomeric, oligomeric, and polymeric species. Likewise, a wide variety of anti-foaming agents may be employed to suppress coating defects. Adhesion promoters may be used as well; again, a wide variety of compounds may be employed to serve this function. A wide variety of monomeric, oligomeric, and polymeric plasticizers such as oligo-and polyethyleneglycol ethers, cycloaliphatic esters, and non-acid reactive steroidally derived materials may be used as plasticizers, if desired. However, neither the classes of compounds nor the specific compounds mentioned above are intended to be comprehensive and/or limiting. One versed in the art will recognize the wide spectrum of commercially available products that may be used to carry out the types of functions that these customary additives perform.

The present invention also relates to a process for generating a resist image on a substrate comprising coating a substrate with a film of the radiation sensitive photoresist composition; imagewise exposing the film to radiation; heating the film, typically to a temperature less than 140° C. or below; and developing the image with a developer. In a bilayer application and/or for use in immersion lithography, a topcoat layer (i.e., overlying layer) may be applied on the film of the radiation sensitive photoresist composition. Advantageously, topcoat layer may be formulated with an alcohol based solvent without any intermixing upon application of the layer onto the silicon containing photoresist composition. The topcoat layer is typically substantially free of a photoacid generator. Optionally, a planarizing layer may first be applied over the substrate such that the resist layer is applied directly to said planarizing layer.

The first step involves coating the substrate with a film comprising the silicon containing resist composition dissolved in a suitable solvent. The film can be coated on the substrate using art known techniques such a spray or spin coating or doctor blading. Optionally, an antireflection coating may first be applied to the substrate. Suitably, before the film is exposed to radiation, the film is heated to an elevated temperature less than 140° C. for a short period of time to remove excess solvent. The dried film can have a thickness of about 0.05 to 10.0 microns.

The film is then image-wise exposed through a photomask to an energy flux of radiation of x-ray, electron beam, EUV or ultraviolet. In one embodiment, the radiation is at a wavelength of 193 nm. The radiation is absorbed by the resist composition and the radiation sensitive acid generator to generate free acid. In immersion lithography, the medium between the photomask and the photoresist layer and/or topcoat layer can be water.

After exposure to radiation, the film can be heated to a temperature of about 140° C. or less for a short period time of about 1 to 2 minute(s) to cause cleavage of the acid labile lactone substituent in the exposed portion of the photoresist composition with subsequent formation of the corresponding acid.

After heating, the top coat, if applicable, is removed prior to or simultaneous with development of the resist image. Then, the resist image is developed in the film by art known techniques to form a relief pattern. Suitably, the film is exposed to a solvent, typically an aqueous base such as tetramethylammonium hydroxide. The solvent removes the portions of the film which were exposed to radiation, thus exposing the underlying substrate. In the current manufacturing process, the topcoat can be removed during the process of developing the resist image without introducing an extra step. Once the relief pattern is formed in the photoresist layer, the relief pattern can be transferred to the underlying substrate. For example, transferring the relief pattern may include a method selected from the group consisting of depositing, implanting, plating, and etching.

The following examples are presented for illustrative purposes only, and are not intended to limit the scope of the invention.

EXAMPLES

In the following examples, efforts have been made to ensure accuracy with respect to numbers (e.g., amounts, temperature, etc.), but allowance should be made for the possibility of errors and deviations. Unless indicated otherwise, parts are parts by weight, temperature is in ° C. and pressure is at or near atmospheric. Additionally, all starting materials were obtained commercially or were synthesized using known procedures. All the monomers reported here are known and purchased from commercial sources or synthesized using known procedures. Where appropriate, the following techniques and equipment were utilized in the Examples: $^1$H and $^{13}$C NMR spectra were obtained at room temperature on an Avance 400 spectrometer. Quantitative $^{13}$C NMR was run at room temperature in acetone-$d_6$ in an inverse-gated $^1$H-decoupled mode using Cr(acac)$_3$ as a relaxation agent on an Avance 400 spectrometer. Thermo-gravimetric analysis (TGA) was performed at a heating rate of 5° C./min in N$_2$ on a TA Instrument Hi-Res TGA 2950 Thermogravimetric Analyzer. Differential scanning calorimetry (DSC) was performed at a heating rate of 10° C./min on a TA Instruments DSC 2920 modulated differential scanning calorimeter. Molecular weights were measured in tetrahydrofuran (THF) on a Waters Model 150 chromatograph relative to polystyrene standards. IR spectra were recorded on a Nicolet 510 FT-IR spectrometer on a film cast on a KBr plate. Film thickness was measured on a Tencor alpha-step 2000.

Example 1

Synthesis of Poly(BTMSMMA-co-NLM-co-ALMA, 30:20:50) (Structure 5)

In this example, bis(trimethylsilyl)methyl methacrylate (BTMSMMA) (2.44 g, 0.01 mole), 5-methacyloyloxy-2,6-norboranecarbolactone (NLM) (1.11 g, 0.005 mole), angelicalactone methacrylate (ALMA) (1.84 g, 0.01 mole) and 16 grams of tetrahydrofuran were placed in a round bottom flask equipped with a condenser and a nitrogen inlet. 2,2'-Azobisisobutyronitrile (AIBN), (0.164 g, 0.001 mole) and 1-dodecanethiol (0.151 g, 0.00075 mole) were added to this solution and stirred until dissolved. Then, the solution was degassed using four vacuum/nitrogen purges. The contents were then heated to reflux for 18 hours. Afterwards, the solution was added drop wise into hexanes (400 ml). The precipitated polymer was filtered (frit), washed twice with hexanes (100 ml) and dried under vacuum at 60° C. Yield: 3.50 grams. Mw=4,195, Polydispersity=1.71, Tg=115 degree C., Composition according to Inv. C NMR: 30:20:50.

Other polymers including Poly(BTMSMMA-co-ALMA, 33:67) and Poly(BTMSMMA-co-NLM-co-MLMA, 29:21:50) were synthesized similarly.

Example 2

Determination of Film Thinning in 4-methyl-2-pentanol (Table 1)

In this example, a 10 wt % polymer solution in propylene glycol monomethyl ether acetate (PGMEA) was prepared. A film was spun cast on a silicon wafer and baked at 110° C. for 60 seconds. Initial thickness was measured in a nanospectrometer. The solvent 4-methyl-2-pentanol was pipetted on the film and after 30 seconds, it was spun off. The film was again baked at 110° C. for 60 seconds. The final thickness was measured to determine the thinning.

TABLE 1

| POLYMER | Feed Ratio | Composition by Inv. C NMR | Silicon Content By weight | Film thinning in 4-methyl-2-pentanol |
|---|---|---|---|---|
| BTMSMMA-co-NLM-co-ALMA | 40:20:40 | 30:20:50 | 8% | none |
| BTMSMMA-co-ALMA | 50:50 | 33:67 | 9% | 3.6% |
| BTMSMMA-co-NLM-co-MLMA | 40:20:40 | 29:21:50 | 7.5% | none |

Example 3

Resist Formulation with Poly(BTMSMMA-co-NLM-co-ALMA, 30:20:50)

In this example, poly(BTMSMMA-co-NLM-co-ALMA, 30:20:50) (1.0 grams), and a sulfonium Photo Acid Generator (PAG) (50 mg) and a base additive (less than the molar amount PAG) were dissolved in propylene glycol monomethyl ether acetate (PGMEA, 7 grams). The solution was filtered through a 0.2 μm filter.

Example 4

Resist Evaluation

Figure 2:
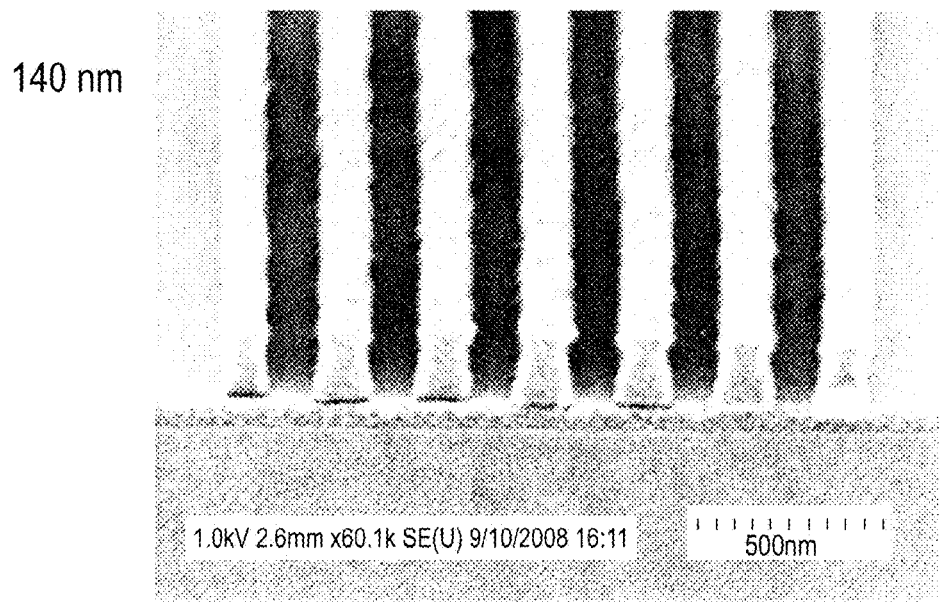
Figure 3:
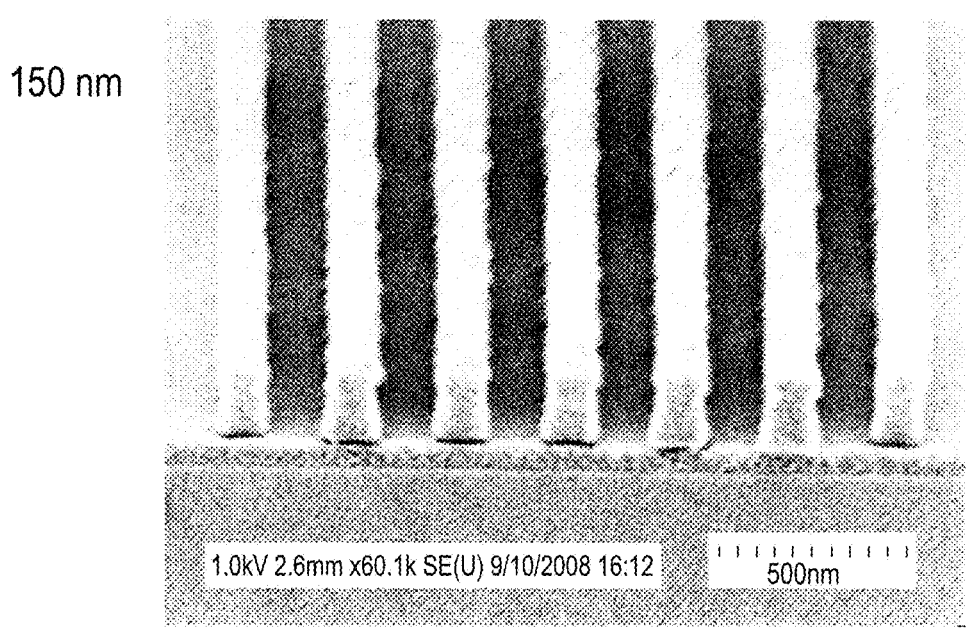

In this example, a silicon substrate was coated with 2300 Å of the positive photoresist composition of Example 3 above. The film was baked at 120° C. for 1 minute to drive off the solvent. The film was then imagewise exposed at 193 nm (dose 5-20 mJ/cm$^2$) on an ISI-Mini Stepper, 0.60 NA. It was then baked at 100° C. for 1 minute and developed with 0.263 N tetramethyl ammonium hydroxide. High resolution images as shown in FIGS. 1-3 were obtained.

Example 5

Exposure Under Immersion Conditions

Figure 4:
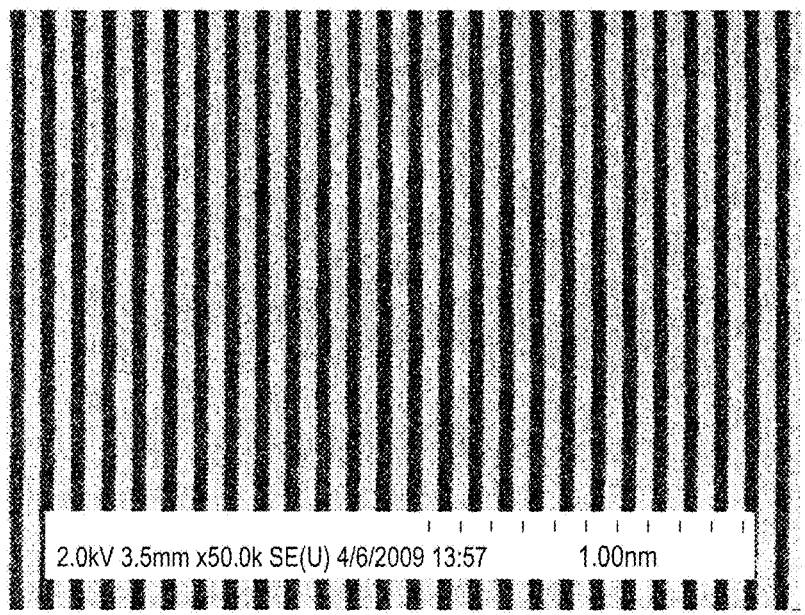
FIG. 4 depicts a scanning electron micrograph of a top down view illustrating a 50 nm half pitch image.

In this example, a silicon substrate was coated with 700 Å of the positive resist composition of Example 3 above. The film was baked at 120° C. for 1 minute to drive off the solvent. A topcoat, TCX-014 from JSR Corporation, was coated over this film and baked at 90° C. for 1 minute. The film stack was then image-wise exposed in a 193 nm interferometric tool under water (dose 1-5 mJ/cm²). It was then baked at 110° C. for 1 minute and developed with 0.263 N tetramethyl ammonium hydroxide. High resolution images as shown in FIG. 4 were obtained.

Example 6

Oxygen Plasma Etch Selectivity

Figure 5C:
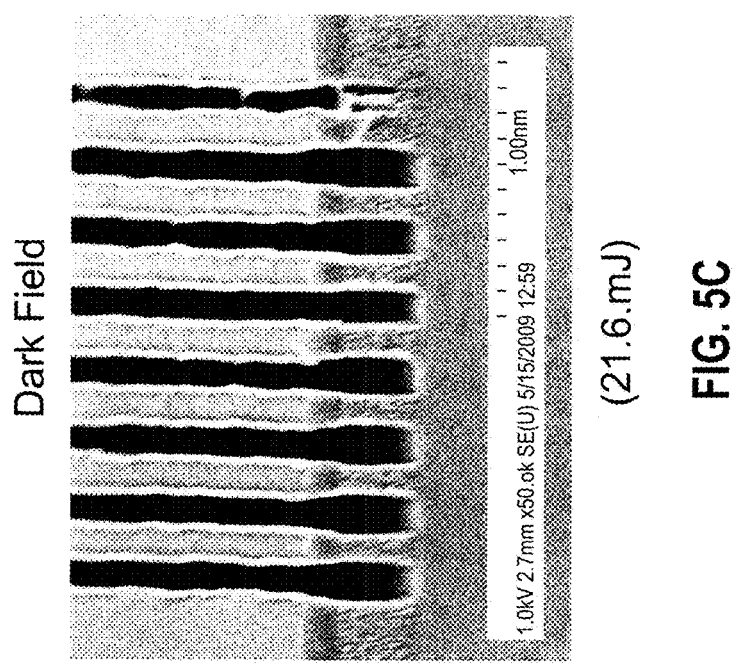
FIGS. 5-6 depict scanning electron micrographs before and after etching at a resolution of 130 nm line/space pairs and 140 nm line space pairs. For the post etch micrographs, bright field and dark field images are provided.
Figure 6C:
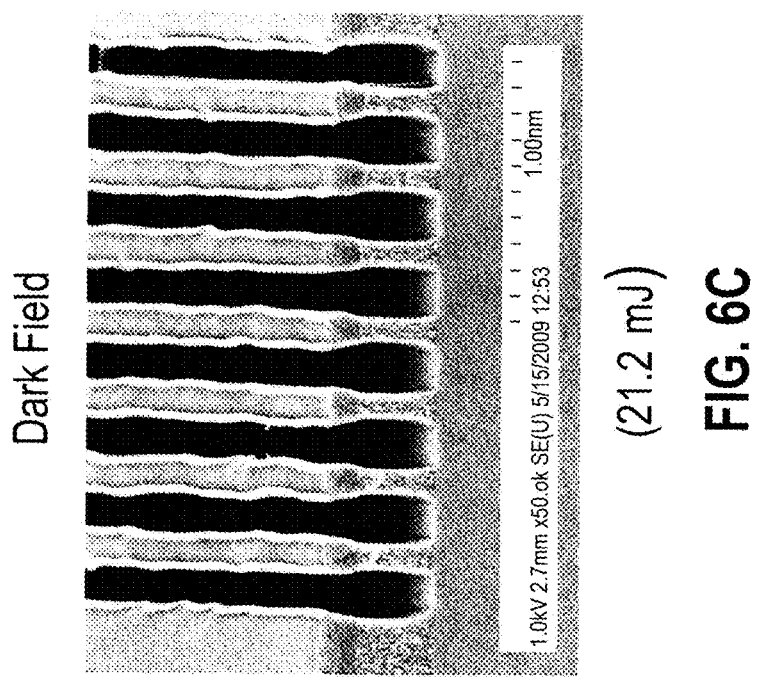

In this example, a silicon substrate containing 3370 Å of a cross-linked organic underlayer was coated with 2260 Å of the positive resist composition of Example 3. The film was baked at 120° C. for 1 minute to drive off the solvent. The film was then image-wise exposed at 193 nm (dose 5-20 mJ/cm²) on an ISI-Mini Stepper, 0.60 NA. It was then baked at 100° C. for 1 minute and developed with 0.263 N tetramethyl ammonium hydroxide. High resolution images before etch and post etch as shown in FIG. 5-6 were obtained. The post etch figures provide bright field and dark field views.

The pattern from the resist structure was then transferred to the underlayer by oxygen reactive ion etching (RIE) (Etch tool: STS Multiplex ICP; Recipe: Coil power—300 W, Platen power—40 W, Pressure—6.0 mT, Gas flow—O2 @ 30 sccm, Time—60 s) as seen in FIG. 4.

The flow diagram in FIG. 1 is just an example. There may be many variations to this diagram or the steps (or operations) described therein without departing from the spirit of the invention. For instance, the steps may be performed in a differing order, or steps may be added, deleted or modified. All of these variations are considered a part of the claimed invention.

The foregoing description of the embodiments of this invention has been presented for purposes of illustration and description. It is not intended to be exhaustive or to limit the invention to the precise form disclosed, and many modifications and variations are possible. Such modifications and variations that may be apparent to a person skilled in the art are intended to be included within the scope of this invention as defined by the accompanying claims.

What is claimed is:

1. A coating composition, comprising:
a polymer comprising

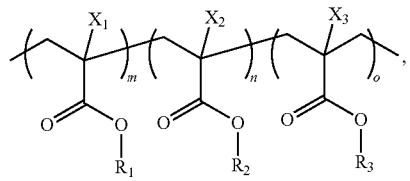

wherein $R_1$ is a silicon containing moiety, $R_2$ is an acid stable lactone functionality, and $R_3$ is an acid labile lactone functionality; $X_1$, $X_2$, $X_3$ are independently H or $CH_3$; and m and o are non-zero positive integers and n is a positive integer representing the number of repeat units, wherein the silicon containing moiety is derived from a monomer selected from the group consisting of:

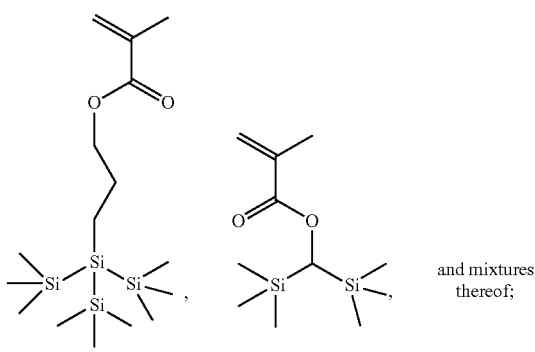

and mixtures thereof;

a photoacid generator; and a solvent.

2. The coating composition of claim 1, wherein the acid stable lactone functionality is not cleaved or otherwise chemically modified upon contact with a photogenerated acid produced by the photoacid generator.

3. The coating composition of claim 1, wherein the acid labile lactone functionality contains at least one covalent bond that is cleaved upon exposure to a photogenerated acid produced by the photoacid generator.

4. The coating composition of claim 1, wherein the ratio of n+o to m+n+o is greater than or equal to 0.6.

5. The coating composition of claim 1, wherein the polymer has a silicon content greater than 5 percent by weight of the polymer.

6. The coating composition of claim 1, wherein the polymer is selected from the group consisting of:

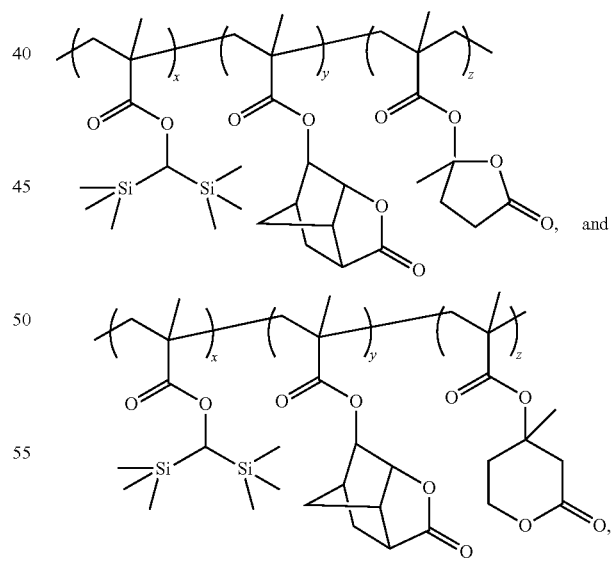

wherein x and z are non-zero integers, y is an integer, and y+z/x+y+z>=0.6.

7. The coating composition of claim 1, wherein the repeating unit containing the acid stable lactone functionality is derived from a monomer selected from the group consisting of:

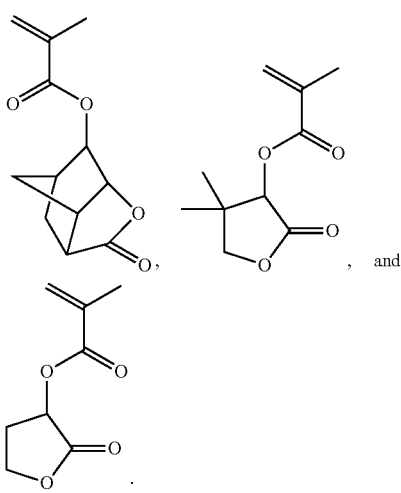

8. The coating composition of claim 1, wherein the repeating unit containing the acid labile lactone functionality is derived from a monomer selected from the group consisting of:

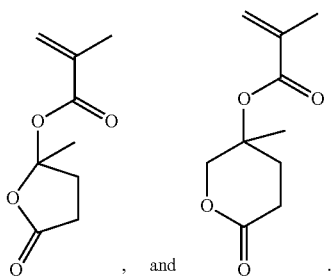

9. The coating composition of claim 1, wherein the silicon containing moiety (m) is 10 to 40 mol percent, the acid stable lactone functionality (n) is greater than 0 to 60 mol percent and the acid labile lactone functionality (o) is 20 to 90 mol percent of the polymer.

10. A method of forming an image in a photoresist layer, comprising:

forming a photoresist layer on a substrate, wherein the photoresist layer comprises a polymer comprising:

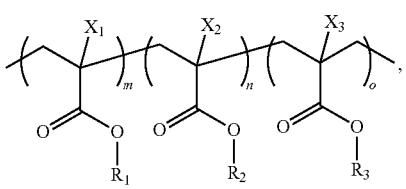

wherein $R_1$ is a silicon containing moiety, $R_2$ is an acid stable lactone functionality, and $R_3$ is an acid labile lactone functionality; $X_1, X_2, X_3$ are independently H or $CH_3$; and m and o are non-zero positive integers and n is a positive integer representing the number of repeat units, and wherein the silicon containing moiety is derived from a monomer selected from the group consisting of:

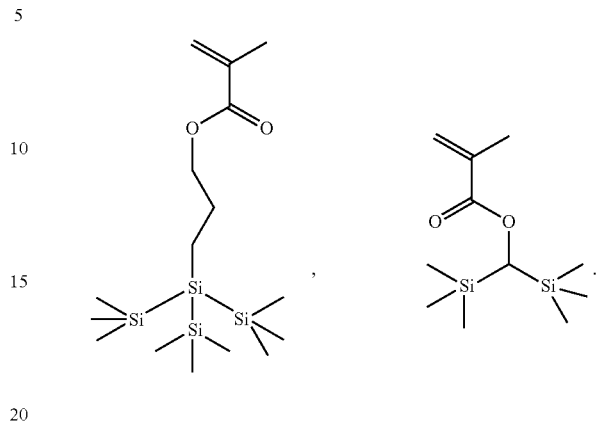

and mixtures thereof; a photoacid generator; and a solvent;

exposing the photoresist layer to radiation through a photomask, wherein the radiation changes the chemical composition of regions of the photoresist layer exposed to the radiation, thereby forming exposed and unexposed regions in the photoresist layer; and optionally baking the exposed photoresist layer to promote acid-catalyzed reaction in exposed portions of the photoresist layer;

developing the photoresist layer to form a relief pattern; and transferring the pattern to the substrate.

11. The method of claim 10, further comprising forming a topcoat layer over the photoresist layer, wherein the topcoat layer comprises an alcohol based solvent.

12. The method of claim 10, further comprising forming a layer of an immersion fluid between the photoresist layer and the photomask.

13. The method of claim 12, wherein the immersion fluid is water.

14. The method of claim 10, wherein the acid stable lactone functionality is not cleaved or otherwise chemically modified upon contact with a photogenerated acid produced by the photoacid generator.

15. The method of claim 10, wherein the acid labile lactone functionality contains at least one covalent bond that is cleaved upon exposure to a photogenerated acid produced by the photoacid generator.

16. The method of claim 10, wherein the ratio of n+o to m+n+o is greater than or equal to 0.6.

17. The method of claim 10, and wherein the polymer has a silicon content greater than 5 percent by weight of the polymer.

18. The method of claim 10, further comprising forming a planarizing layer over the substrate, and wherein the photoresist layer is applied directly to the planarizing layer.

19. The method of claim 10, wherein the step of transferring further comprises a method selected from the group consisting of depositing, implanting, plating, and etching.

20. A coating composition, comprising:
a polymer is selected from the group consisting of:
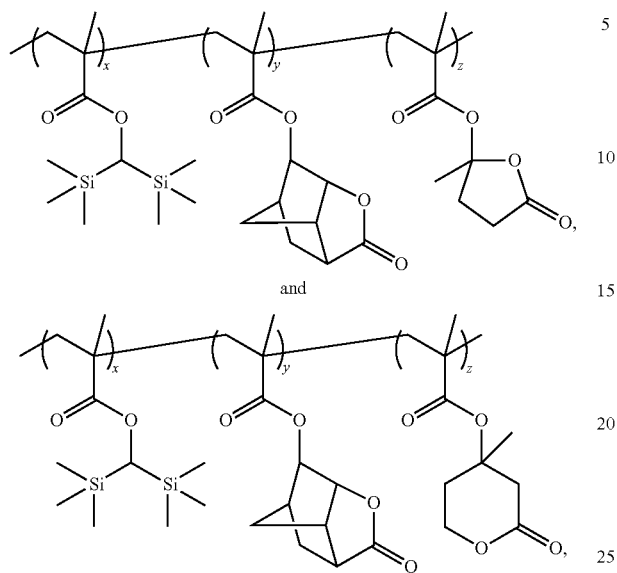
wherein x and z are non-zero integers, y is an integer, and y+z/x+y+z>=0.6
   a photoacid generator; and
   a solvent.